(12) United States Patent
Bofill-Petit et al.

(10) Patent No.: US 8,169,263 B2
(45) Date of Patent: May 1, 2012

(54) DIFFERENTIAL GM-BOOSTING CIRCUIT AND APPLICATIONS

(75) Inventors: Adrià Bofill-Petit, Barcelona (ES); Xavier Redondo-Navarro, Barcelona (ES)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/639,900

(22) Filed: Dec. 16, 2009

(65) Prior Publication Data

US 2011/0140782 A1 Jun. 16, 2011

(51) Int. Cl.
*H03F 3/45* (2006.01)

(52) U.S. Cl. ........................................................ 330/260

(58) Field of Classification Search .................. 330/253, 330/260
See application file for complete search history.

(56) References Cited

U.S. PATENT DOCUMENTS

| | | | |
|---|---|---|---|
| 5,856,757 A | 1/1999 | Eschauzier | |
| 6,278,321 B1 * | 8/2001 | Franck | 330/254 |
| 6,498,530 B1 * | 12/2002 | Tang | 330/9 |
| 7,102,433 B2 | 9/2006 | Lee et al. | |
| 7,193,466 B2 * | 3/2007 | Kim et al. | 330/258 |
| 7,202,740 B2 | 4/2007 | Leete | |
| 7,414,472 B2 * | 8/2008 | Ito et al. | 330/253 |
| 7,795,973 B2 * | 9/2010 | Hurwitz et al. | 330/254 |

OTHER PUBLICATIONS

International Search Report; PCT/US10/52815; Feb. 3, 2011; 4 pages.

* cited by examiner

*Primary Examiner* — Steven J Mottola
(74) *Attorney, Agent, or Firm* — Garlick & Markison; Holly L. Rudnick

(57) ABSTRACT

A fully-differential circuit includes a differential gm-boosting circuit and/or a differential output circuit. The use of differential gm-boosting and output circuits improves input common-mode and power-supply noise rejection relative to the prior art. The fully differential gm-boosted circuit may be used in a wide variety of applications.

29 Claims, 12 Drawing Sheets

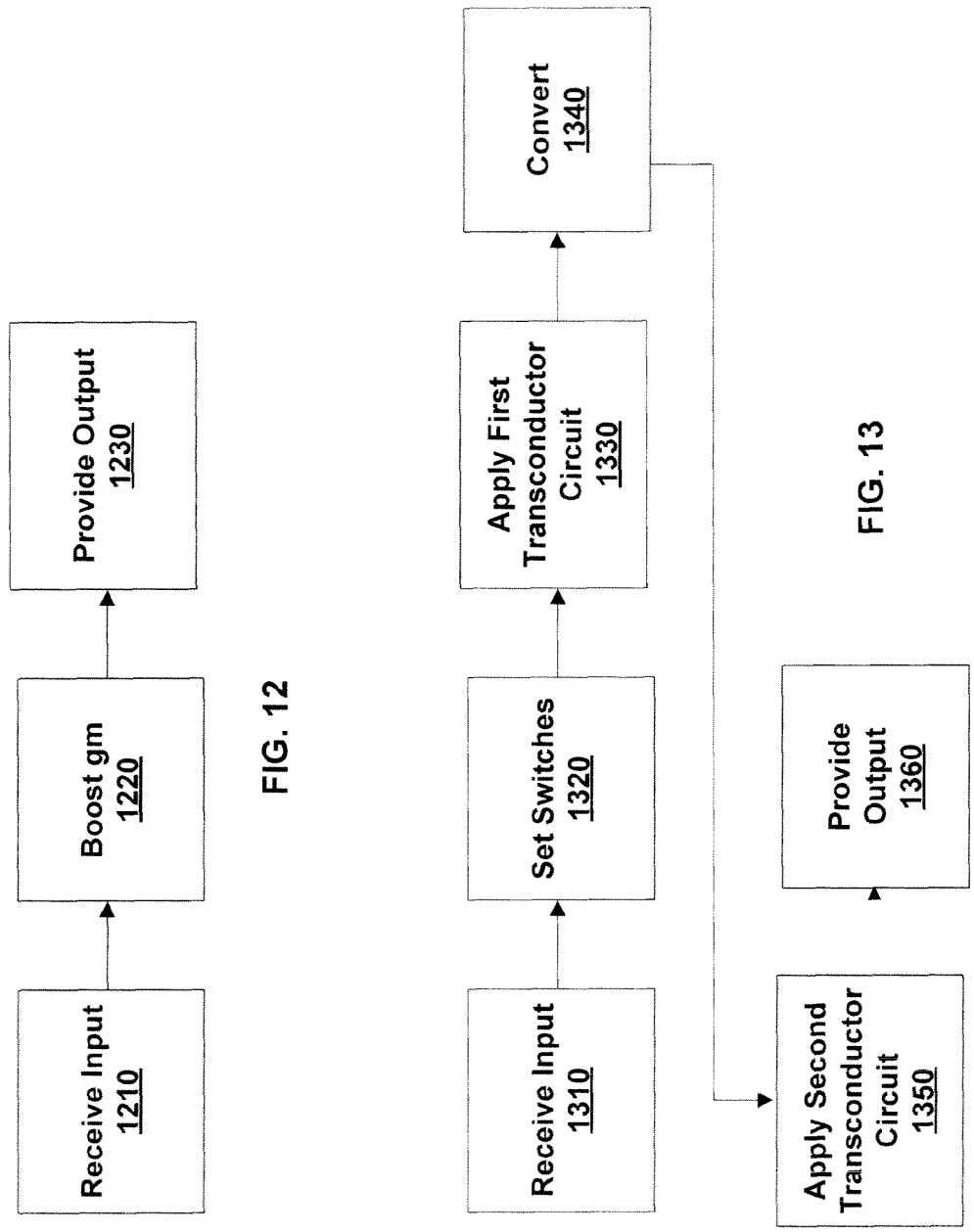

DIFFERENTIAL GM-BOOSTING CIRCUIT AND APPLICATIONS

CROSS-REFERENCE TO RELATED APPLICATIONS

This application is related to U.S. Pat. No. 7,795,973 entitled "Programmable Gain Amplifier" and filed Oct. 13, 2008, and to U.S. Pat. No. 7,602,220 entitled "Resistor-Input Transconductor Including Common-Mode Compression" and filed Jun. 24, 2008.

The disclosures of the above patent and patent application are hereby incorporated herein by reference.

BACKGROUND

1. Field of the Invention

The invention is in the field of electronics, and more specifically in the field of differential mode electronics.

2. Related Art

FIG. 1 is an illustration of a low input impedance Current Mirror 100 of the prior art. Current Mirror 100 operates by using a feedback loop to assure that an output current is proportional to an input current. A constant bias voltage is applied to the gate of Transistor 115. The current through Transistor 115 depends on the voltage difference between the gate and the source. A current through a Transistor 120 is dependent on a voltage on the gate of Transistor 120. The voltage at a Node 150 is held constant by a negative feedback loop between Transistors 115 and 120. If the voltage at Node 150 rose then the current through Transistor 115 would decrease. However this current fall would increase the voltage at Node 125. The voltage at Node 125 is applied to the gate of Transistor 120, and thus the increase of voltage at Node 125 would cause an increase on current flow through Transistor 120. The increase in current flow through Transistor 120 increases the gate-to-source voltage of Transistor 115. Since the gate voltage $V_{bias}$ of Transistor 115 is held constant the voltage at Note 150 falls and completes the negative feedback.

Transistor 120 and a Transistor 130 share a common gate voltage. The current through each is, therefore, dependent on the voltage at Node 125. If Current Source 145 is matched to Current Source 110, and Transistors 120 and 130 have the same quiescent current and are built from matched unit devices, a current at an Output 135 must be essentially proportional to a current at an Input 140.

Current ($I_{120}$) through Transistor 120 will be the sum of the input current $I_{in}$ and the current $I_{110}$ provided by Current Source 110, ($I_{120}=I_{in}+I_{110}$). Likewise the current ($I_{130}$) through Transistor 130 will be the current ($I_{145}$) provided by Current Source 145 minus the output current ($I_{out}$), ($I_{130}=-I_{out}+I_{145}$). Because of these relationships, when $I_{120}=I_{130}$, $I_{out}=-I_{in}$. Current amplification can be achieved by selecting the various ratios of the transconductances of Transistors 120 and 130. The Current Mirror 100 is referred to as a gm-boosted current mirror because the transconductance (gm) of Transistor 115 is boosted by the gain at Node 125, which stabilizes the voltage at Node 150 and thus creates a very low impedance input.

FIG. 2 is an illustration of a Pseudo-Differential Transconductor 200 of the prior art. This circuit operates on the same general principals as Current Mirror 100 discussed in reference to FIG. 1. However, to achieve a differential output a mirrored pair of circuits is used. Mirrored elements of these circuits (and other mirrored circuits discussed herein) are referred to herein by a numeric value and the numeric value prime ('). As used herein the term "mirrored" is used to refer to components, typically having essentially the same characteristics, disposed on opposing sides of a differential circuit, each of the opposing sides being configured to process one side of a differential input signal. Specifically, a voltage difference between an Input 205 and an Input 205' is reproduced between Nodes 210 and 210' using a negative feedback loop including an Input Transistor 215 (215') and a differential Amplifier 220 (220'). Any difference between the voltages at Input 205 and 205' and, thus, Node 210 and Node 210', results in a current ($I_R$) through a Resistor 225. Output currents $I_{outp}$ and $I_{outn}$ at Nodes 240 and 240' are equal to a current ($I_{230}$) from a Current Source 230 minus a current $I_{235}$ into a Current Sink 235, and minus $I_R$, ($I_{230}-I_{235}-I_R=I_{out}$). The sign of $I_R$ is dependent on which way current flows though Resistor 225, thus, if $I_{230}$ equals $I_{235}$, $I_{out}$ and $I_{out}'$ will be equal in magnitude but opposite in polarity.

To build a linear transconductor it is common to boost the gm of a transistor by means of feedback loops. The boosted gm is used to generate a smaller (but better controlled) actual gm of the circuit. In FIG. 2, the controlled actual gm of the circuit is provided by the Resistor 225 (gm=$1/R_{225}$, where $R_{225}$ is the resistance of Resistor 225). A wide variety of methods of manipulating the gm of a transistor or a transconductor are known in the art and that of circuit of FIG. 2 is but one example of these methods. A transistor or other component is considered gm-boosted when a circuit is used to manipulate (raise or lower) its effective gm. The circuit used to manipulate the effective gm is referred to as a gm-boosting circuit.

Pseudo-Differential Transconductor 200 is not fully differential because some components are not differential with respect to the two sides of the mirrored circuit. For example, Amplifier 220 is not differential with respect to the input voltages $V_{inn}$ and $V_{inp}$, although Amplifiers 220 and 220' are differential with respect to their own inputs. It is common that components of a differential circuit configured to manipulate the gm of transistors cause the circuit to be only pseudo-differential rather than fully differential because each input or input node is independently gm-boosted and/or the current to do so has not come from a common source. As used herein the term "fully-differential" is meant to indicate a circuit in which those components used to boost or otherwise manipulate the effective gm of the circuit are themselves differential with respect to the differential inputs of the circuit and optionally also differential with respect to signals internal to the circuit, e.g., differential with respect to each side of the mirrored circuit.

SUMMARY

The invention includes a fully differential circuit in which the gm of a pair of input transistor type elements is manipulated in a differential manner and gm-boosting circuits receive current from a common source. Embodiments of the invention may be included in a wide variety of circuit systems such as transconductors, current gain amplifiers, current to voltage converters, gmC filters, inductance gyrators and/or the like.

Various embodiments of the invention comprise a circuit including a pair of input transistors; and a differential gm-boosting circuit configured to boost a gm of the pair of differential input transistors such that the gm-boosted circuit is fully differential.

Various embodiments of the invention comprise a differential amplifier including a first fully-differential gm-boosted circuit; a second fully-differential gm-boosted circuit; and a plurality of switches configured to control the gain of the differential amplifier by selectively including the second fully-differential gm-boosted circuit in an output path of the differential amplifier.

Various embodiments of the invention comprise an integrated circuit including a digital logic circuit; and a fully-differential gm-boosted circuit configured to receive a differential analog input signal and to supply a differential output signal. the fully-differential gm-boosted circuit and the digital logic circuit being disposed on a same semiconductor substrate.

Various embodiments of the invention comprise a method including receiving a differential input at a pair of mirrored input components: boosting the gm of the mirrored input components using a differential gm-boosting circuit comprising a current source shared by a pair of mirrored gm-boosting components; and providing a differential output proportional to the differential input. In these methods, providing the differential output optionally includes providing current from a shared current source to a mirrored pair of output components.

BRIEF DESCRIPTION OF THE DRAWINGS

FIG. 12 illustrates a method of differentially processing a signal, according to various embodiments of the invention.

FIG. 13 illustrates a method of using a programmable gain amplifier, according to various embodiments of the invention.

DETAILED DESCRIPTION

Various embodiments of the invention comprise a fully-differential circuit including a differential gm-boosting circuit, and optionally a differential output circuit. The differential gm-boosting circuit can be adapted to a differential circuit in which gm-boosting may be of use. For example, the same concepts may be used in a current-to-current converter, a voltage-to-voltage converter, a voltage-to-current converter, a transconductor, or in a current-to-voltage converter.

Figure 3:
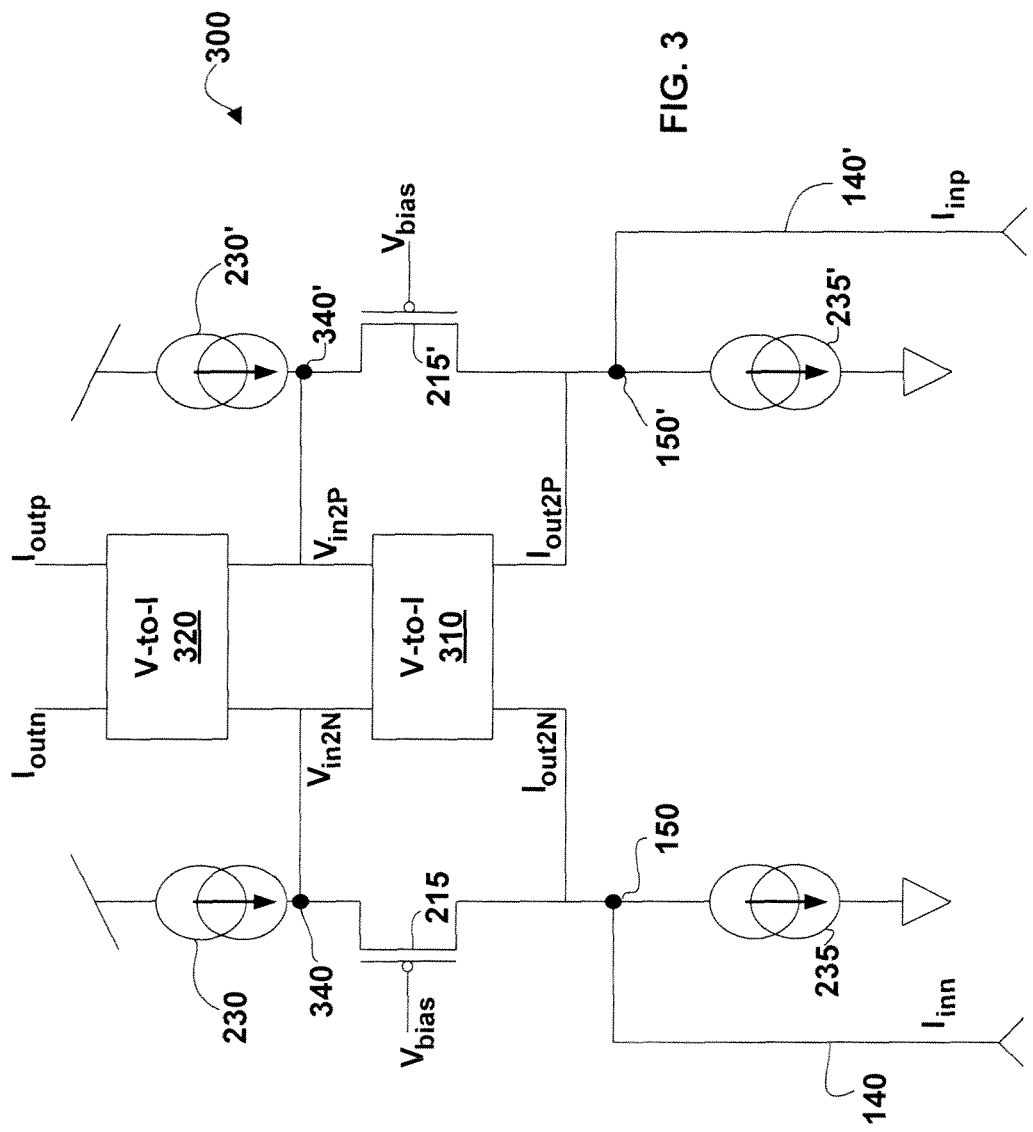
FIG. 3 is an illustration of a fully-differential circuit, according to various embodiments of the invention.

FIG. 3 is an illustration of a fully-differential Circuit 300, according to various embodiments of the invention. In Circuit 300 the gm of the Input Transistors 215 and 215' are manipulated, e.g., boosted, using a differential V-to-I (voltage to current) Circuit 310. V-to-I Circuit 310 is configured to receive a differential voltage input $V_{in2N}$ and $V_{in2P}$ and provide a differential current output $I_{out2N}$ and $I_{out2P}$. The differential current output ($I_{out2P}-I_{out2N}$) is proportional to the differential voltage input ($V_{in2P}-V_{in2N}$). V-to-I Circuit 310 is configured to boost the effective gm of Input Transistors 215 and 215' (or the equivalents) in a differential manner. As such, the gm-boosting is fully differential. The amount of gm boosting that occurs is a function of the transconductance of V-to-I Circuit 310. V-to-I Circuit 310 may include a wide variety of alter differential circuits. One of ordinary skill in the art will understand that many known V-to-I circuits may be used to provide the function of V-to-I Circuit 310. In alternative embodiments. Input Transistors 215 and 215' are replaced by circuits configured to perform similar functions. V-to-I Circuit 310 is an example of a transconductor. A transconductor is a circuit that supplies a current output at the two output terminals of the circuit in a manner dependent of the voltage received at the two input terminals of the circuit, where at least one of the output terminals is not at the same electrical node as any of the two input terminals.

The input currents $I_{inp}$ and $I_{inn}$ will result in opposite changes of the gate-to-source voltages of Transistors 215 and 215' (i.e., voltage difference between $V_{bias}$ and the voltages at Nodes 150 and 150', respectively). The voltage differences at Nodes 150 and 150' is amplified at Nodes 340 and 340'. In response to this voltage difference, V-to-I circuit 310 provides a differential current output ($I_{out2P}-I_{outN}$). This differential output current is approximately equal to the difference between the received currents $I_{inp}$ and $I_{inn}$. V-to-I Circuit 310 and Transistors 215 and 215' create a gm-boosting feedback. From the point of view of the input, the gm of Input Transistors 215 and 215' is boosted by the open-loop gain from Node 150 (150') to Node 340 (340') and the transconductance of V-to-I Circuit 310.

A differential current or voltage output of Circuit 300 may be obtained from a variety of different locations within the circuit. In the example illustrated by FIG. 3, a differential V-to-I Circuit 320 is used to produce a differential current output $_{outn}$ and $I_{outp}$. V-to-I Circuit 320 optionally has the same characteristics as V-to-I Circuit 310 such that the differential current between $I_{outn}$ and $I_{outp}$ is the same as the difference between $I_{out2N}$ and $I_{out2P}$. Alternatively, V-to-I Circuit 230 may have a different transconductance than V-to-I Circuit 310. The differential current output between $I_{outn}$ and $I_{outp}$ is proportional to the difference between input currents $I_{mp}$ and $I_{inn}$.

Figure 4:
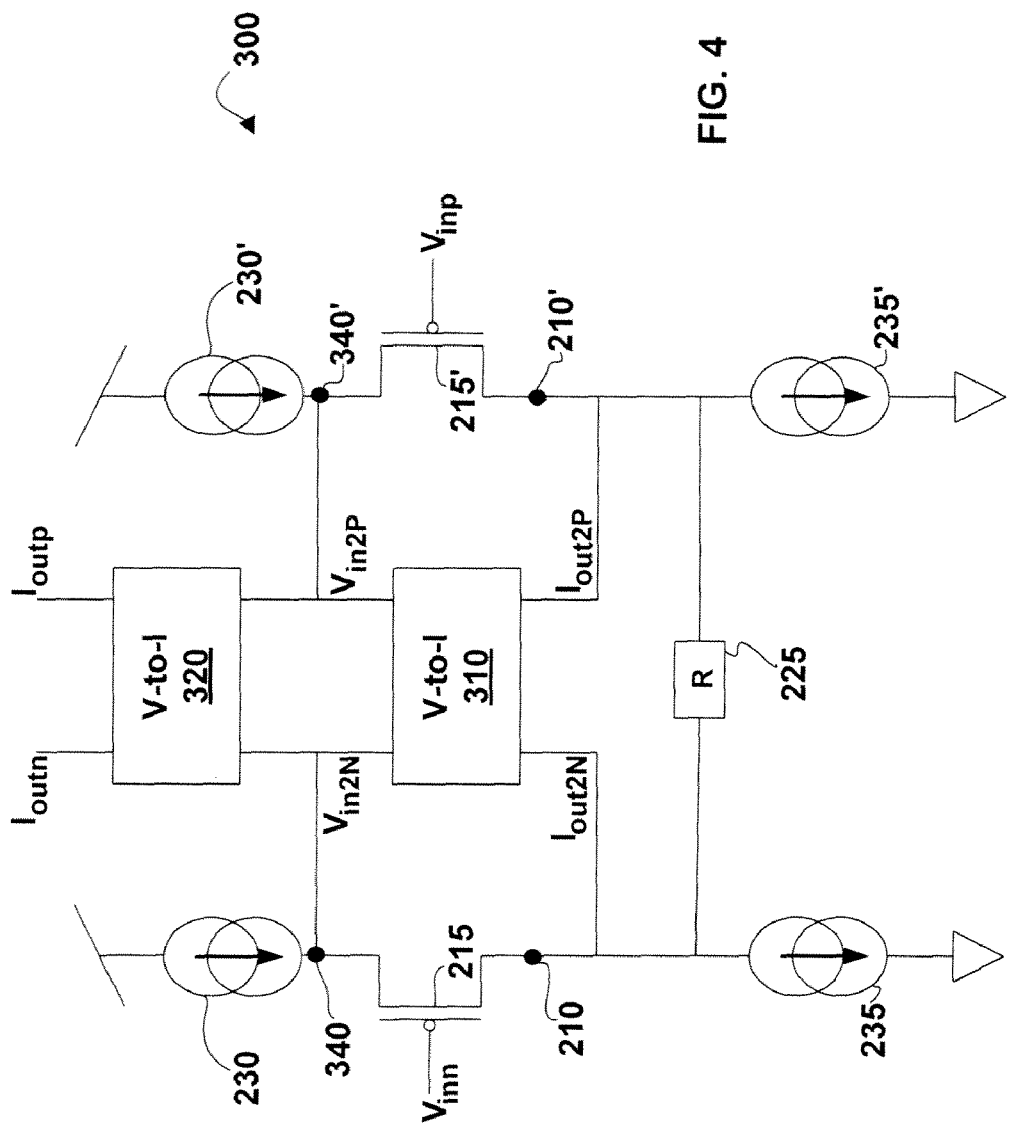
FIG. 4 is an illustration of a fully differential circuit including a differential voltage input and a differential current output, according to various embodiments of the invention.

FIG. 4 is an illustration of an embodiment of fully-differential Circuit 300 including a differential voltage input and a differential current output. The voltage input is received at the gates of Transistors 215 and 215'. A change of voltage at the gate of Transistors 215 and 215' can be taken as a starting point to describe the negative gm-boosting feedback loop. As was described in relation to FIG. 3, the changes in gate-to-source voltage at input Transistors 215 and 215' are amplified at Nodes 340 and 340'. The voltage difference between Nodes 340 and 340' is converted to a current by V-to-I circuit 310. The resulting current difference ($I_{out2P}-I_{outN}$) flows mostly through Resistor 225 and thus creates a voltage difference between Nodes 210 and 210'. This change in the voltages of Nodes 210 and 210' opposes the initial change in gate-tosource voltage ($V_{inp}-V_{inn}$) of Transistors 215 and 215', and thus closes the negative feedback. As a result, $I_{out2p}-I_{out2n}=(V_{inp}-V_{inn})/R$.

The differential current output is generated by coupling $V_{in2N}$ and $V_{in2P}$ to the second differential V-to-I Circuit 320. V-to-I Circuit 320 may include a wide variety of alternative differential circuits and is optionally a copy of V-to-I Circuit 310. The differential current output $I_{outn}$ and $I_{outp}$ of V-to-I Circuit 320 is essentially the same as or proportional to the differential current output $I_{out2N}$ and $I_{out2P}$ of V-to-I Circuit 310, and represents the differential current output of Circuit 300. The transconductance of Transconductor Circuit 300 is determined by the value of Resistor 225 and is also optionally determined by selecting a ratio of the transconductances of V-to-I Circuit 320 and V-to-I Circuit 310. The embodiments of Circuit 300 illustrated by FIG. 4 comprise a transconductor.

Figure 1:
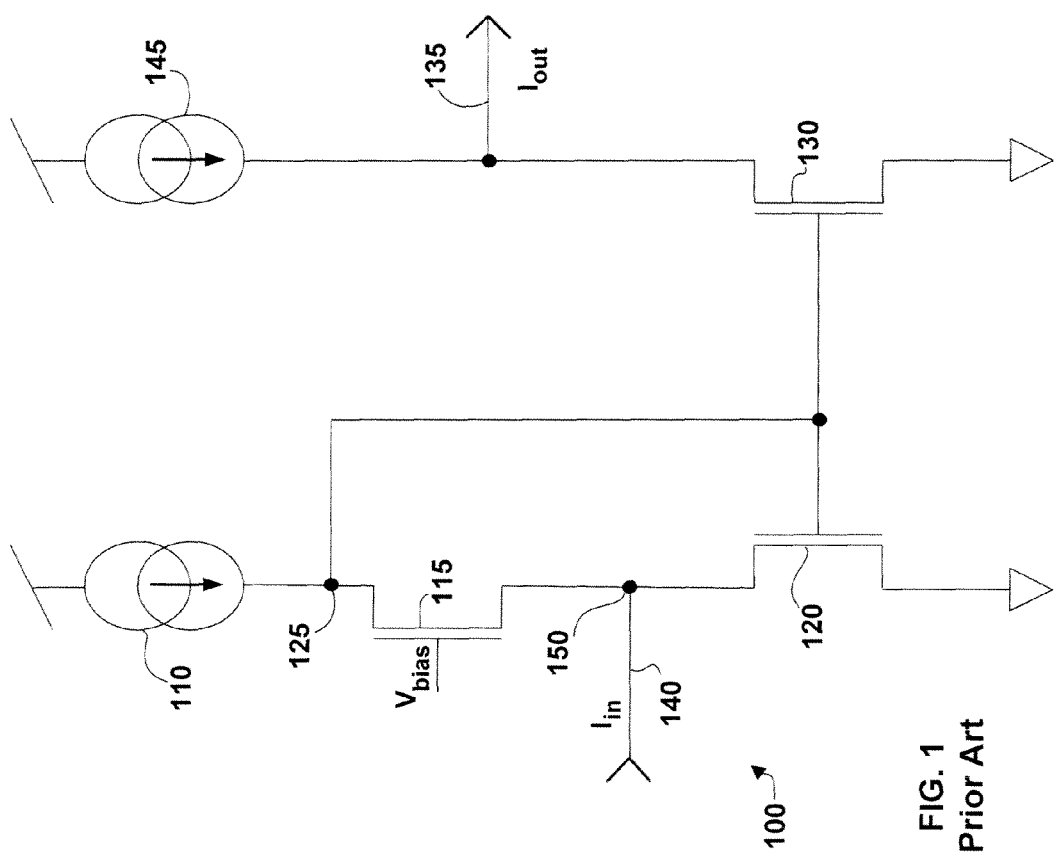
FIG. 1 is an illustration of a low-impedance current mirror of the prior art.
Figure 5:
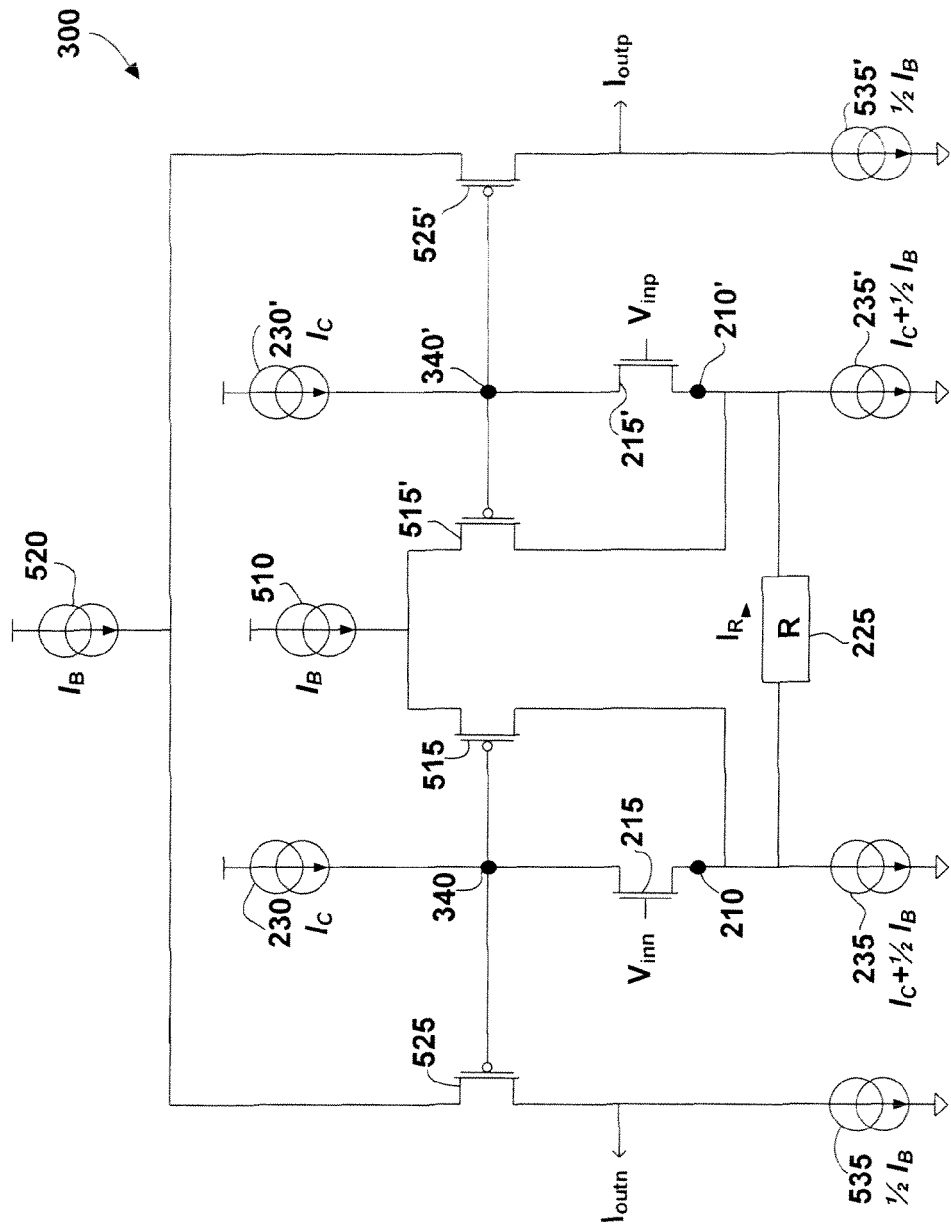
FIG. 5 is a more detailed illustration of an embodiment of the fully differential circuit of FIG. 4.

FIG. 5 is a more detailed illustration of an embodiment of the fully-differential circuit of FIG. 4. In this embodiment V-to-I Circuit 310 comprises a Current Source 510, and a differential pair made-up of gm-boosting Transistors 515 and 515'. In an analogous manner as was described for the circuit of FIG. 1, the gm of Transistor 215 and Transistor 215' is boosted by the gain at Node 340 and a Node 340' and the gm of the differential pair of Transistors 515 and 515'. The boosting of the gm of Transistor 215 and the gm of Transistor 215' is done by the same differential circuit, which makes the circuit also differential in its internal implementation, and thus fully-differential. The current supplied by Current Source 510 is shared by Transistors 515 and 515'. Likewise, V-to-I Circuit 320 comprises a Current Source 520, a pair of Transistors 525 and 525', and a pair of Current Sinks 535 and 535'. These components represent a fully-differential output circuit. The current supplied by Current Source 520 is shared by Transistors 525 and 525'. Current Sinks 235 and 235' receive the current from one of Current Sources 230 and 230', respectively, and also half of the current from Current Source 510. The current through Resistor 225 ($I_R$) circulates through gm-boosting Transistors 515 and 515'. Both the input and the output stage of the circuit are implemented using differential circuits. The circuit is, thus, fully-differential.

Figure 6:
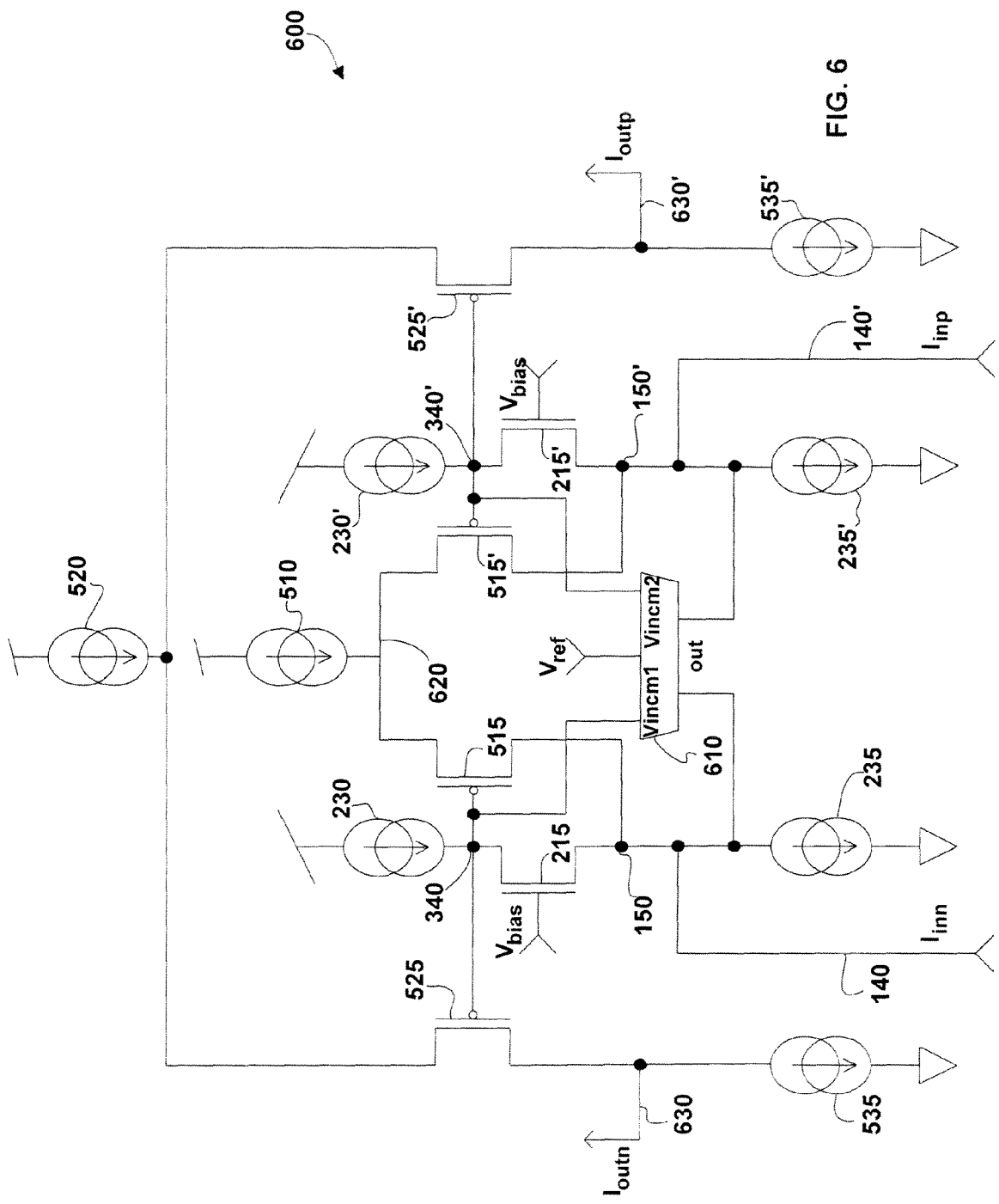
FIG. 6 is an illustration of a differential current-current amplifier including gm-boosting, according to various embodiments of the invention.

FIG. 6 is an illustration of a Differential Current-Current Amplifier 600 including gm-boosting, according to various embodiments of the invention. Differential Current-Current Amplifier 600 is an alternative embodiment of Circuit 300. Briefly, differential currents applied to the pair of Inputs 140 and 140' result in a voltage difference at the sources of Input Transistors 215 and 215' (Nodes 150 and 150', respectively). These voltages are amplified at the drains of Input Transistors 215 and 215' (Nodes 340 and 340', respectively). The amplified voltages at the drains of Input Transistors 215 and 215' cause a change in the current flowing through a mirrored pair of gm boosting Transistors 515 and 515'. This change in current is fed back to Nodes 150 and 150'. This completes a fully-differential gm-boosting feedback loop on each side of Differential Current-Current Amplifier 600. This feedback loop stabilizes the voltages at Nodes 150 and 150', allowing them to operate as low-impedance virtual grounds.

Quiescent current to the gm boosted circuit is supplied by Current Sources 230 and 230'. These currents flow through Input Transistors 215 and 215' and into Current Sinks 235 and 235'. The total current entering Current Sinks 235 and 235' is approximately the same as the current supplied by Current Sources 230 and 230' through Input Transistors 215 and 215' plus half the current of Current Source 510. Any added differential current received from Inputs 140 and 140' circulates through gm-boosting Transistors 515 and 515'. The current introduced through Inputs 140 and 140' increases the error voltage difference at the sources of Input Transistors 215 and 215'. As a result the amplified voltage difference at the gates of gm-boosting Transistors 515 and 515' increases, thus allowing more differential current to flow through gm-boosting Transistors 515 and 515'.

Any current flowing through either of gm-boosting Transistors 515 or 515' will cause a division of the constant current of Current Source 510 between the two Transistors 515 and 515'. Current Source 510 is coupled to both of gm boosting Transistor 515 and gm boosting Transistor 515'. As such, this current source will affect both sides of Differential Current-Current Amplifier 600. This connection to a common current source will typically improve the differential nature of the circuit and, for example, reduce the effects of noise or other imperfections that may be present on only one side of the circuit.

Gm-boosting Transistors 515 and 515' are each part of a different current mirror. One of these current mirrors comprises Transistor 515 and an Output Transistor 525, and the other of these current mirrors comprises Transistor 515' and an Output Transistor 525'. As discussed above with respect to the circuit illustrated in FIG. 1, a current such as those of Differential Current-Current Amplifier 600 can be used to assure that the current flowing through one transistor is proportional to the current flowing through another of the transistors. If the transistors have similar lengths and widths, and Current Sources 510 and 520 have similar output current, then the Differential Current-Current Amplifier 600 will have a gain of one. Gains different than one may be selected by choosing the width/length ratio of Transistor 525 (525') to be different than the width/length ratio of Transistor 515 (515'), and optionally the ratio of currents between Current Source 510 and Current Source 520. A current mirror is not to be confused with a mirrored pair of elements.

The Output Transistors 525 and 525' are optionally disposed in a differential configuration including a common source. For example, as illustrated in FIG. 5 the sources of these transistors may be coupled to a common Current Source 520 to produce a fully differential output circuit. As with gm-boosting Transistors 515 and 515', this coupling of Transistors 525 and 525' serves to reduce output common mode current due to a common-mode voltage present at both the gate of Transistor 525 and the gate of Transistor 525'. Output currents $I_{outn}$ and $I_{outp}$ are provided through Outputs 630 and 630', respectively. These outputs are coupled to Current Sinks 535 and 535'.

Differential Current-Current Amplifier 600 further comprises an optional Common-Mode Feedback Circuit 610. Common-Mode Feedback Circuit 610 is typically configured to keep Nodes 340 and 340' from taking undefined values. Common-Mode Feedback Circuit 610 also helps correct for any common-mode currents received through Inputs 140 or 140'. This occurs because Common-Mode Feedback Circuit 610 is configured to receive the voltage at the drains of Input Transistors 515 and 515' and to feed back a corrective current to Inputs 140 and 140'.

Figure 7:
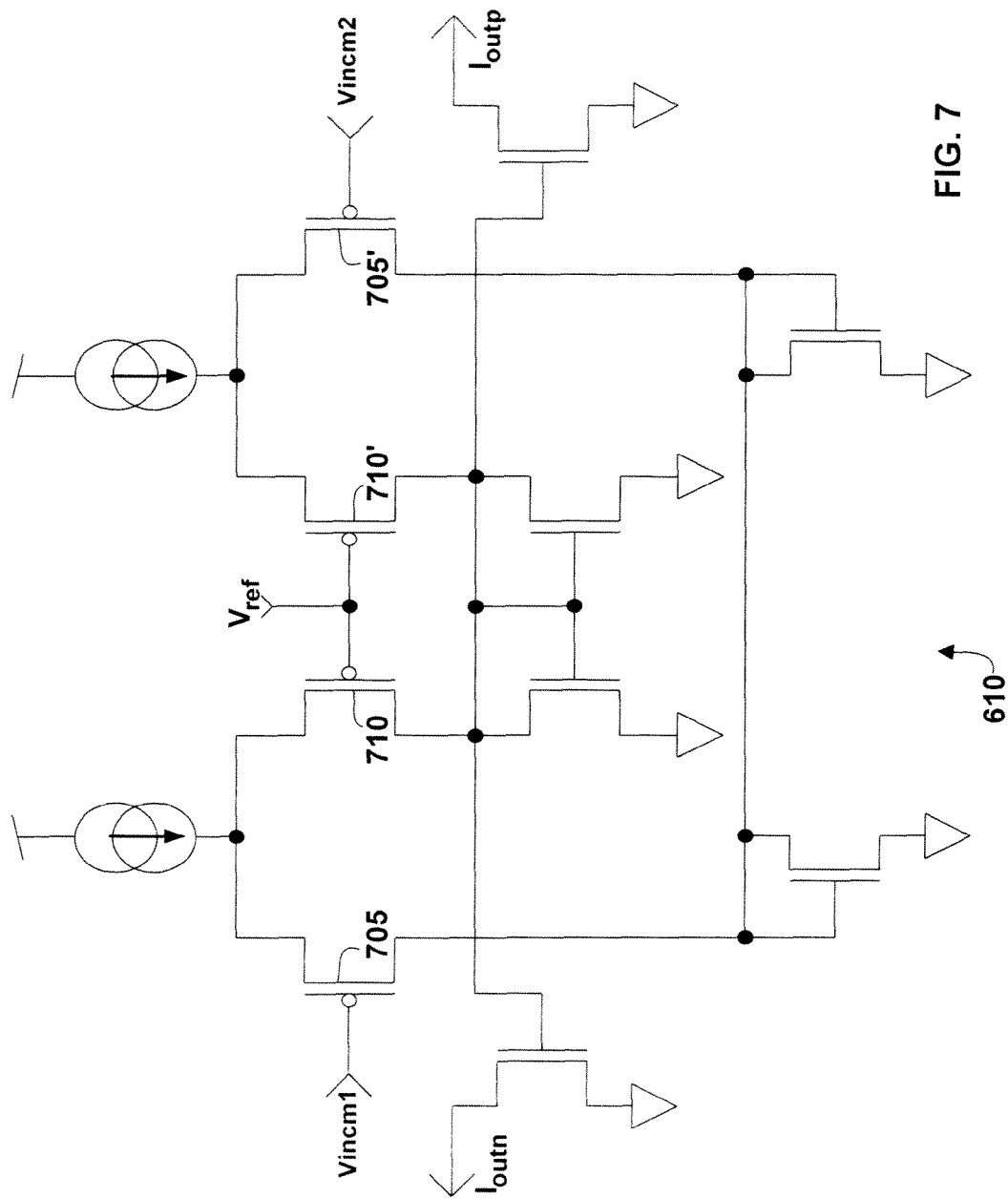
FIG. 7 is an illustration of a differential common-mode amplifier, according to various embodiments of the invention.

A variety of common-mode feedback circuits are known in the art. Many of these may be adapted for use in Differential Current-Current Amplifier 600. FIG. 7 is an illustration of one differential common-mode feedback amplifier that may be included in Differential Current-Current Amplifier 600, according to various embodiments of the invention. In these embodiments, Common-Mode Feedback Circuit 610 is configured to receive voltage at the gates of Transistors 705 and 705'. Transistors 705 and 705' are each part of a different pair of differential transistors, each pair sharing a common current source. In each of these pairs the opposing Transistors 710 and 710' have a reference voltage $V_{ref}$ applied to their gate.

Figure 8:
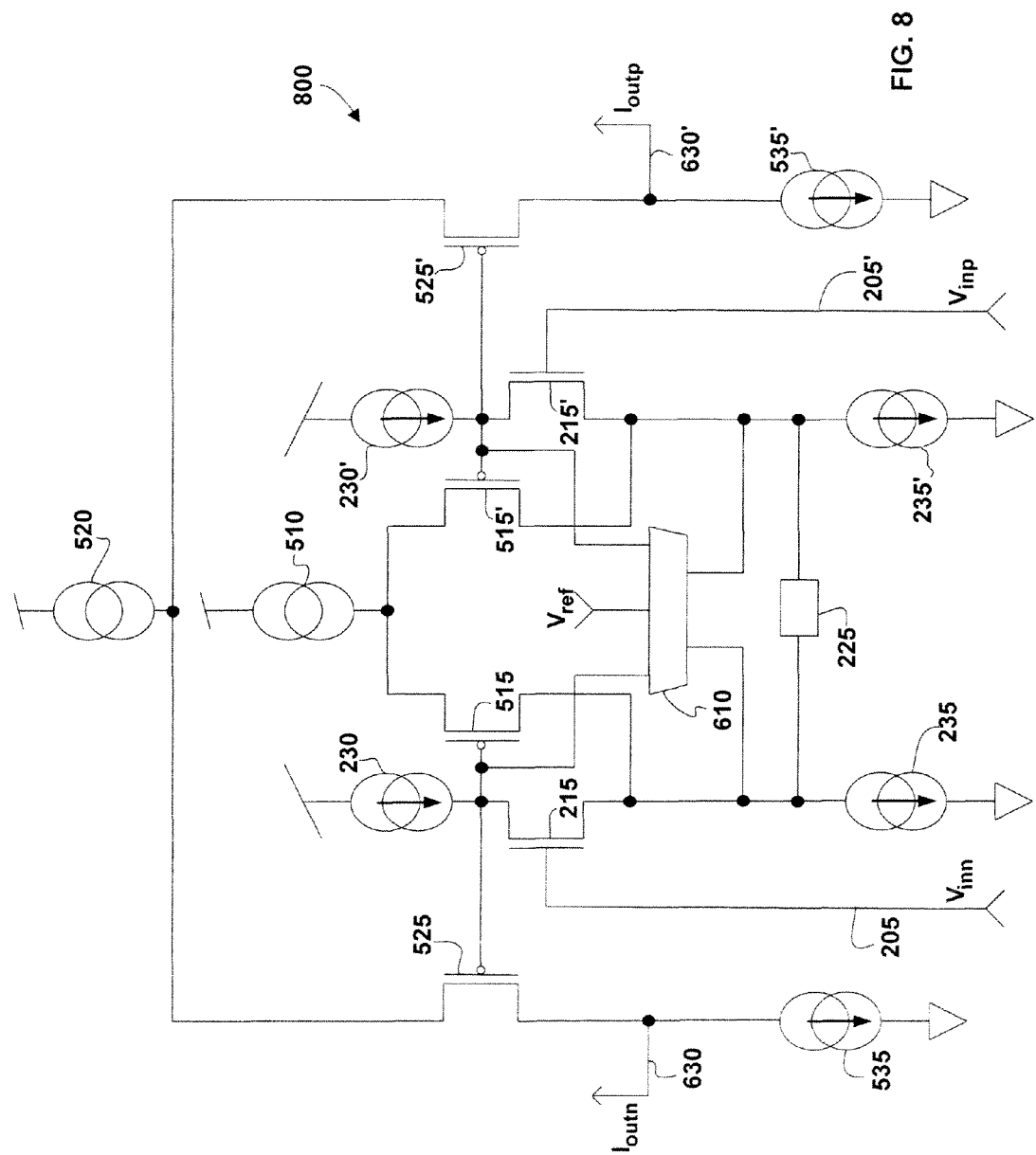
FIG. 8 is an illustration of a differential gm-boosted transconductor including a floating resistor, according to various embodiments of the invention.

FIG. 8 is an illustration of a fully Differential Transconductor 800 including a floating resistor, according to various embodiments of the invention. Differential Transconductor 800 is an alternative embodiment of Circuit 300. As in Differential Current-Current Amplifier 600, Differential Transconductor 800 comprises gm-boosting Transistors 515 and 515' disposed within feedback loops of gm-boosted current mirrors including Transistors 525 and 525'. Differential Transconductor 800 differs from Differential Current-Current Amplifier 600 in that the Inputs 205 and 205' are coupled to the gates of Input Transistors 215 and 215'. This provides a high-impedance input and makes the circuit responsive to the differential voltages at Inputs 205 and 205'. Any differences in the voltages at Inputs 205 and 205' results in a difference in the voltage at the sources of Transistors 215 and 215'. This voltage difference is amplified at the drains of Transistors 215 and 215'. This voltage difference creates a current difference through Transistors 515 and 515' which flows through Resistor 225. The voltage drop across Resistor 225 created b the differential current in Transistors 515 and 515' must equal the voltage difference at the source of Transistors 215 and 215, thus closing the feedback loop. This current flowing through the resistors has the same effect on the circuit as did the input currents discussed in relation to FIG. 6.

Specifically, this current flowing through gm-boosting Transistors 515 and 515' is mirrored at the Output Transistors 525 and 525'. respectively. The current flowing through Resistor 225 is, thus, reflected at Outputs 630 and 630'. The transconductance of Differential Transconductor 800 is dependent on both the value of the resistor and the gain of the current mirrors comprising Transistors 515 (515') and 525 (525').

Figure 2:
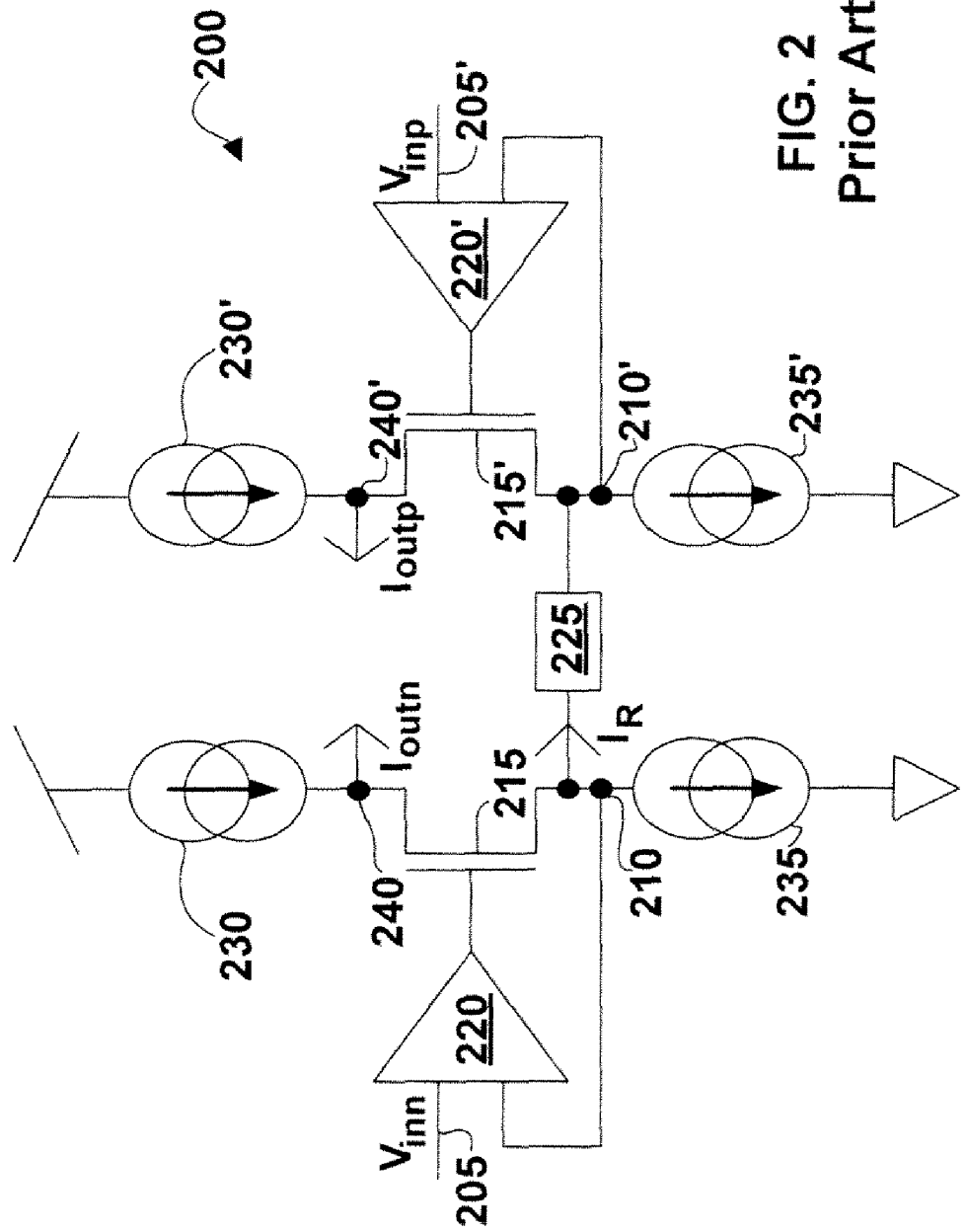
FIG. 2 is an illustration of a pseudo-differential transconductor of the prior art.

Differential Transconductor 800 has several advantages over Pseudo-Differential Transconductor 200 illustrated in FIG. 2. For example, because the gm boosting Transistors 515 and 515' are linked at their sources to a common Current Source 510, the gm-boosting circuit is fully differential and each of the two sides of the differential amplifier is less subject to noise or offset of Current Source 510 or the power supply tied to the Current Source. Likewise, because the output Transistors 525 and 525' share Common Current Source 520 any common mode currents through these transistors are reduced.

As was explained in relation to FIG. 6, Differential Transconductor 800 also includes a Common-Mode Feedback Circuit 610 which sets the biasing point of Nodes 340 and 340'. Common-Mode Feedback Circuit 610 is typically differential. Various types of common-mode feedback circuits arc know in the art. One of ordinary skill in the art will be able to select one of these circuits for use as Common-Mode Feedback Circuit 610, with the benefit of the teachings included herein.

Figure 9:
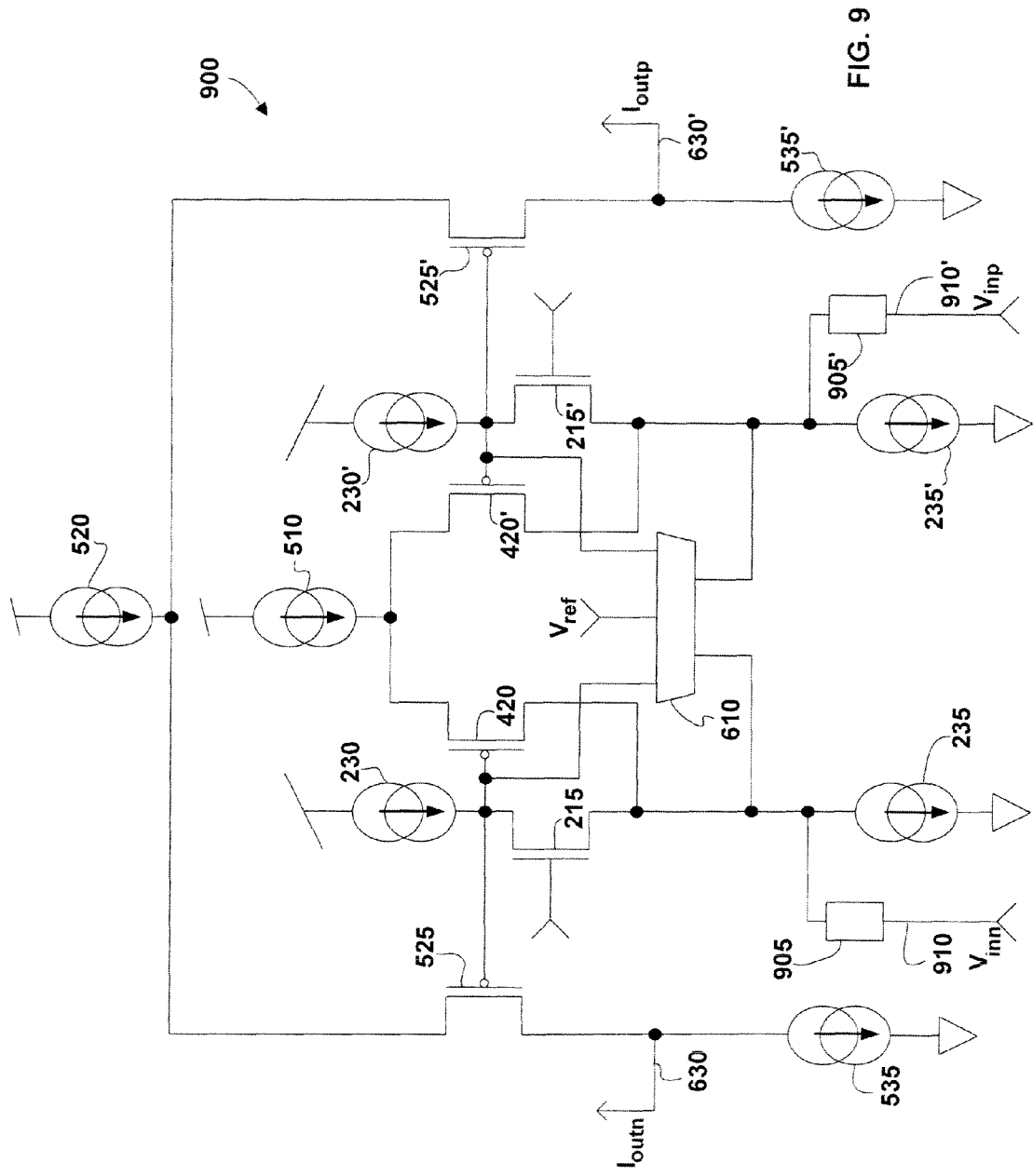
FIG. 9 is an illustration of a differential gm-boosted transconductor including single-ended resistor inputs, according to various embodiments of the invention.

FIG. 9 is an illustration of an alternative gm-boosted Differential Transconductor 900, according to various embodiments of the invention. Differential Transconductor 900 is an alternative embodiment of Transconductor Circuit 300. These embodiments comprise single-ended resistor Inputs 910 and 910'. The Resistors 905 and 905' at these inputs serve to convert input voltages to currents. These currents are provided to the source of Input Transistors 215 and 215' and cause the circuit to operate as described elsewhere herein, for example with respect to FIG. 6.

Figure 10:
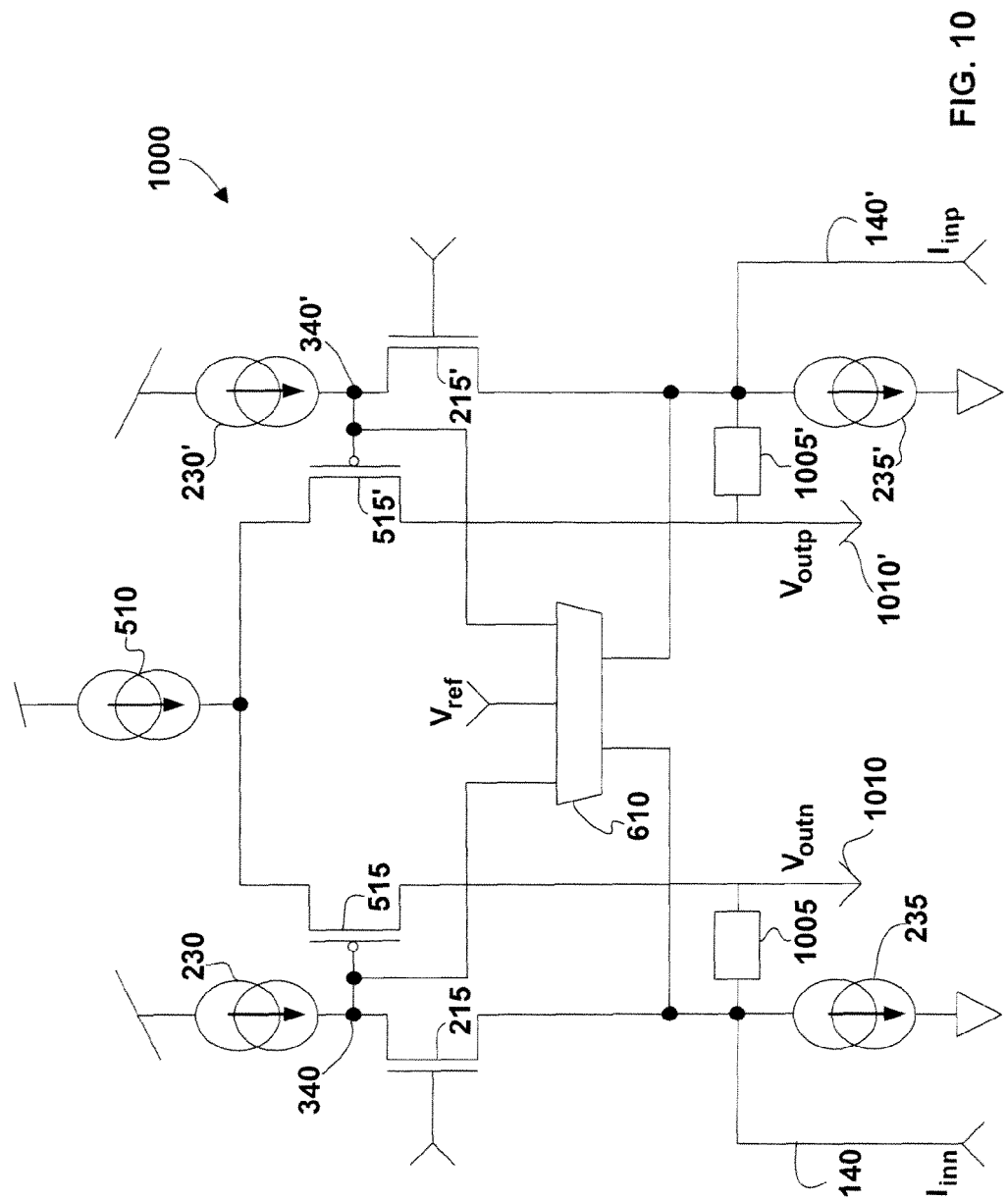
FIG. 10 is an illustration of a differential gm-boosted current-to-voltage converter, according to various embodiments of the invention.

FIG. 10 is an illustration of a differential gm-boosted Transimpedance Amplifier 1000 (current-to-voltage converter), according to various embodiments of the invention. Transimpedance Amplifier 1000 is an alternative embodiment of Circuit 300. As with other circuits discussed herein, Transimpedance Amplifier 1000 comprises Input Transistors 215 and 215' coupled to a gm-boosting circuit. Current at Inputs 140 and 140' results in a change in voltage at the drains of Input Transistors 215 and 215' (Nodes 340 and 340', respectively). This changes the current flow through gm-boosting Transistors 515 and 515'. The resulting current change is fed back to Inputs 140 and 140' completing the gm-boosting feedback loop. A voltage output is generated by including Resistors 1005 and 1005' between the drains of gm-boosting Transistors 515 and 515' and the Inputs 140 and 140', respectively. These resistors result in a voltage at Outputs 1010 and 1010' The resulting voltage output ($V_{outn}-V_{outp}$) is proportional to $R(I_{inn}-I_{inp})$, where R is the resistance of Resistors 1005 and 1005'. The transimpedance can therefore be selected by, for example, changing the value R.

Figure 11:
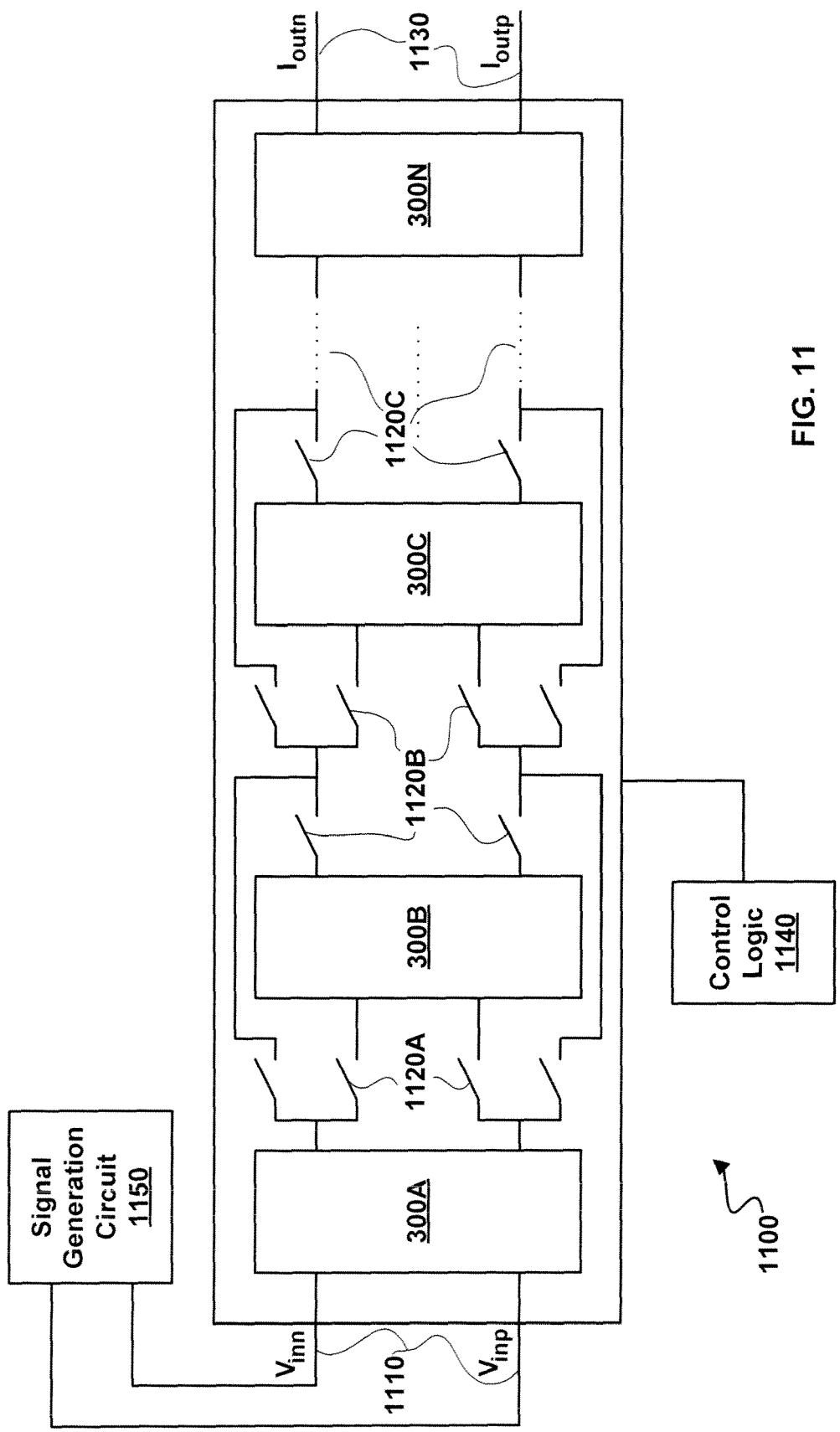
FIG. 11 is an illustration of a differential programmable gain amplifier, according to various embodiments of the invention.

FIG. 11 is an illustration of a Differential Programmable Gain Amplifier 1100, according to various embodiments of the invention. Differential Programmable Gain Amplifier 1100 comprises a plurality of fully differential gm-boosted Circuit 300, individually labeled 300A, 300B, 300C . . . 300N. Differential Programmable Gain Amplifier 1100 may include one, two, three, four or more of fully-differential gm-boosted Circuits 300. These fully-differential gm-boosted Circuits 300 are coupled to a Differential Input 110 and a Differential Output 1130. A set of Switches 1120. individually labeled 1120A, 1120B, 1120C. etc., are configured to control the gain of Differential Programmable Gain Amplifier 1100 by selectively including members of the Circuits 300A, 300B, 300C. etc. in the path between Differential Input 1110 and Differential Output 1130. For example, switches 1120A may be set to alternatively either include or exclude Circuit 300B from the output path of Differential Programmable Gain Amplifier 1100. In those embodiments wherein Circuit 300A, 300B, 300C and/or 300N are a transconductor, a current to voltage converter is optionally included in Circuits 300 between each transconductor. For example, a transconductor is typically followed by either a current-current amplifier or a current-to-voltage circuit. Likewise, a current-current amplifier is typically followed by either another current-current amplifier or by a current-to-voltage converter; and a current-to-voltage converter is followed by either a voltage-to-current converter or a voltage-to-voltage converter. As needed, these various components may be included in embodiments of Circuit 300.

Differential Programmable Gain Amplifier 1100 optionally further includes Control Logic 1140 configured to control Switches 1120. Control Logic 1140 may be responsive to a user input, to a control signal, to a magnitude of an input signal received at Differential Input 1110, and, or the like. Control Logic 1140 optionally includes digital logic circuits. These digital logic circuits may be disposed on a same semiconductor substrate, e.g., silicon substrate, as the analog portions of Differential Programmable Gain Amplifier 1100. Control Logic 1140 and Transconductor Circuits 300 may be disposed on the same semiconductor chip.

Differential Programmable Gain Amplifier 1100 optionally further includes Signal Generation Circuit 1150 configured to genera e a signal and to provide this signal to Differential Input 1110. Signal Generation Circuit 1150 optionally includes digital logic circuits and may be responsive to a user input, to a control signal, digital input data. a communication signal, and or the like. These digital logic circuits of Signal Generation Circuit 1150 may be disposed on a same semiconductor substrate, e.g., silicon substrate, as the analog portions of Differential Programmable Gain Amplifier 1100. For example, Signal Generation Circuit 1150 and Circuits 300 may be disposed on the same semiconductor chip. Signal Generation Circuit 1150 optionally includes analog circuits such as termination resistors. For example, the reception resistance seen by the signal source may be controlled by the use of resistors.

While embodiments of Differential Programmable Gain Amplifier 1100 illustrated in FIG. 11 are voltage-to-current amplifiers, alternative embodiments include voltage-to-voltage, current-to-voltage or current-to-current amplifiers.

FIG. 12 illustrates a method of differentially processing a signal, according to various embodiments of the invention. This method may be performed by, for example, the various fully-differential gm-boosted embodiments of Circuit 300 discussed herein. In a Receive Input Step 1210, a differential input is received. This input may be a current input or a voltage input, and is optionally received from a signal generation circuit. The received signal is optionally received at Input Transistors 215 and 215'.

In a Boost gm Step 1220 a differential gm-boosting circuit is used to boost the gm of Input Transistors 215 and 215', or their equivalents. This gm-boosting circuit may include, for example, using the pair of mirrored Transistors 515 and 515' and Current Source 510. The gm-boosting is performed in a fully-differential manner, for example, using a mirrored pair of components and a shared current source.

In a Provide Output Step 1230, a differential output is provided. The differential output may be provided by a differential circuit which copy (differentially) a signal which either controls, or is generated by, the gm-boosting components used in Boost gm Step 1220, e.g., current flowing through Transistors 515 and 515'. The differential output may include either a current or voltage output.

FIG. 13 illustrates a method of using a program able gain amplifier. such as Differential Programmable Gain Amplifier 1100, according to various embodiments of the invention. In this method the gain of the programmable gain amplifier is selected and the programmable gain amplifier is used to amplify a differential input signal. In a Receive Input Step 1310, a differential input signal is received. This signal can be a current or voltage signal. The signal is optionally received from a signal generating circuit disposed on the same semiconductor substrate as the programmable gain amplifier.

In a Set Switches Step 1320, one or more switches are set to select which fully-differential gm-boosted circuits are included in an output path of the programmable gain amplifier. The switch settings may result in zero, one, two, three, four or more Circuits 300 being included in the output path. For example, one switch state may result in Circuits 300A and 300B being included in the output path, while another switch state may result in Circuit 300A but not Circuit 300B being in the output path. Set Switches Step 1320 optionally occurs prior to Receive Input Step 1310. Switches are optionally set using Control Logic 1140.

In an Apply First Circuit Step 1330, a fully-differential gm-boosted embodiment of Circuit 300A is used to amplify the differential signal received in Receive Input Step 1310. This amplification may result in a differential current or differential voltage output. For example, this step optionally includes generation of a differential output current from a differential voltage or current signal. Apply First Circuit Step 1330 may include use of embodiments wherein Circuit 300A is a transconductor.

In an optional Convert Step 1340 the current or voltage generated in Apply First Circuit Step 1330 is converted to an appropriate from for introduction into the next Circuit 300 of the signal path. This conversion may include conversion of a differential voltage signal to a differential current signal, or conversion of a differential current signal into a differential voltage signal. The type of conversion performed is optionally dependant on the identity of the next Circuit 300 in the signal path of Differential Programmable Gain Amplifier 1100. The conversion of Convert Step 1340 is typically fully differential.

In an Apply Second Circuit 1350, the output of Circuit 330A is amplified by the next embodiment of Circuit 300 in the output path of Differential Programmable Gain Amplifier 1100, e.g. Circuit 330B or Circuit 330C, etc. This output has optionally been converted in Convert Step 1340. The amplification results in a differential output that is optionally amplified and/or converted by further fully-differential gm-boosted circuits in Differential Programmable Gain Amplifier 1100.

In a Provide Output Step 1360, the output of the final circuit in the output path of Programmable Gain Amplifier 1110 is provided as a differential output of Programmable Gain Amplifier 1110. This output may be a current output or a voltage output.

Further discussion of alternative configurations and uses of Differential Programmable Gain Amplifier 1100 is included in related U.S. patent application Ser. No. 12,250,450 entitled "Programmable Gain Amplifier" and filed Oct. 13, 2008.

Several embodiments are specifically illustrated and/or described herein. However, it will be appreciated that modifications and variations are covered by the above teachings and within the scope of the appended claims without departing from the spirit and intended scope thereof For example, the various individual components discussed herein, such as current sources, resistors and transistors, may be replaced by alternative circuits configured to perform similar operations. The logic discussed herein may include hardware, firmware and/or software stored on a computer readable medium.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. An electronic circuit comprising:
a pair of differential gm-boosted input transistors; and
a differential gm-boosting circuit coupled between source and drain terminals of the pair of differential gm-boosted input transistors configured to boost a gm of the pair of differential gm-boosted input transistors such that the electronic circuit is fully differential;
wherein the differential gm-boosting circuit includes a mirrored pair of gm-boosting components and a current source shared by the mirrored pair of gm-boosting components.

2. The electronic circuit of claim 1, wherein the electronic circuit is configured to receive a differential voltage input.

3. The electronic circuit of claim 1, wherein the electronic circuit is configured to receive a differential current input.

4. The electronic circuit of claim 1, wherein the electronic circuit is configured to generate a differential voltage output.

5. The electronic circuit of claim 1, wherein the electronic circuit is configured to generate a differential current output.

6. The electronic circuit of claim 1, wherein a differential current input is received at a source or at a drain of the gm-boosted transistors.

7. The electronic circuit of claim 1, wherein the gm-boosting circuit is responsive to a difference in voltage between sources or between drains of the pair of gm-boosted transistors.

8. The electronic circuit of claim 1, further comprising:
a pair of mirrored resistors each disposed between a source of one of the pair of differential gm boosted transistors and an output of the differential gm-boosting circuit, respectively.

9. The electronic circuit of claim 1, further comprising:
a resistor disposed between sources of the pair of differential gm boosted input transistors.

10. The electronic circuit of claim 1, further comprising:
a pair of mirrored resistors each disposed between an input of the electronic circuit and a source of one of the input gm-boosted transistors, respectively.

11. The electronic circuit of claim 1, further comprising a fully differential output circuit configured to provide a differential output proportional to a differential input received by the fully-differential gm-boosted circuit.

12. The electronic circuit of claim 11, wherein the output circuit includes a current source shared by a mirrored pair of output transistors.

13. The electronic circuit of claim 12, wherein each of the output transistors is configured to provide one side of a differential output of the circuit, respectively.

14. The electronic circuit of claim 1, further comprising a common-mode feedback circuit.

15. The electronic circuit of claim 1, wherein the gm-boosting circuit is configured such that power supply noise from a power supply of the gm-boosting circuit is rejected from an output of the electronic circuit.

16. A differential amplifier comprising:
a first fully-differential gm-boosted circuit;
a second fully-differential gm-boosted circuit;
a plurality of switches configured to control gain of the differential amplifier by selectively including the second fully-differential gm-boosted circuit in an output path of the differential amplifier; and
a digital logic circuit configured to control the plurality of switches, the digital logic circuit and the first fully-differential gm-boosted circuit being disposed on a same semiconductor substrate.

17. The differential amplifier of claim 16, wherein the first fully-differential gm-boosted circuit includes a current source shared by a mirror pair of output components.

18. The differential amplifier of claim 17, wherein each of the output components is configured to provide one side of a differential output of the first fully-differential gm-boosted circuit respectively.

19. The differential amplifier of claim 16, wherein the differential amplifier is configured to receive a differential voltage input and to supply a differential current output.

20. The differential amplifier of claim 1, wherein the differential amplifier is configured to receive a differential voltage input and to supply a differential voltage output.

21. The differential amplifier of claim 16, wherein the differential amplifier is configured to receive a differential voltage input and to supply a differential current output.

22. The differential amplifier of claim 16, wherein the differential amplifier is configured to receive a differential current input and to supply a differential voltage output.

23. The differential amplifier of claim 16, wherein the differential amplifier is configured to receive a differential current input and to supply a differential current output.

24. An integrated circuit comprising:
a signal generation circuit for generating a differential input signal;
a first fully-differential gm-boosted circuit configured to receive the differential input signal and to supply a differential analog output signal along an output path;
a second fully-differential gm-boosted circuit configured to receive the differential analog output signal and to supply an additional differential analog output signal along the output path, the first and second fully-differential gm-boosted circuits and the signal generation circuit being disposed on a same semiconductor substrate; and
a switch configured to selectively include the second fully-differential gm-boosted circuit in the output path.

25. The integrated circuit of claim 24, further comprising a digital logic circuit configured to control the switch and disposed on the same semiconductor substrate.

26. The integrated circuit of claim 24, wherein the first fully-differential gm-boosted circuit include a fully-differential transconductor.

27. A method comprising:
receiving a differential input at a pair of differential gm-boosted input transistors;
boosting the gm of the differential gm-boosted input transistors using a differential gm-boosting circuit coupled between source and drain terminals of the pair of differential gm-boosted input transistors, the differential gm-boosting circuit comprising a current source shared by a pair of mirrored gm boosting components; and
providing a differential output proportional to the differential input.

28. The method of claim 27, wherein providing the differential output includes providing current from a shared current source to a mirrored pair of output components.

29. The electronic circuit of claim 1, wherein the gm-boosting circuit includes a differential voltage to current converter.

* * * * *

UNITED STATES PATENT AND TRADEMARK OFFICE
CERTIFICATE OF CORRECTION

| | |
|---|---|
| PATENT NO. | : 8,169,263 B2 |
| APPLICATION NO. | : 12/639900 |
| DATED | : May 1, 2012 |
| INVENTOR(S) | : Bofill-Petit et al. |

It is certified that error appears in the above-identified patent and that said Letters Patent is hereby corrected as shown below:

In the Claims

Col. 12, line 4, in claim 20: replace "amplifier of claim 1" with --amplifier of claim 16--

Signed and Sealed this
Twenty-second Day of October, 2013

Teresa Stanek Rea
*Deputy Director of the United States Patent and Trademark Office*